United States Patent [19]
Yokajty

[11] Patent Number: 5,777,855
[45] Date of Patent: Jul. 7, 1998

[54] METHOD AND APPARATUS FOR CONNECTING FLEXIBLE CIRCUITS TO PRINTED CIRCUIT BOARDS

[75] Inventor: Joseph E. Yokajty, Webster, N.Y.

[73] Assignee: Eastman Kodak Company, Rochester, N.Y.

[21] Appl. No.: 664,611

[22] Filed: Jun. 18, 1996

[51] Int. Cl.⁶ .................................................. H05K 1/11
[52] U.S. Cl. ........................... 361/803; 361/749; 439/77; 439/67
[58] Field of Search ................... 174/250, 253, 174/254, 260; 257/700, 723, 724; 361/728, 733, 748, 749, 767, 774, 776, 777, 784, 789, 803; 439/48, 50, 55, 59, 62, 64, 65, 67, 68, 69, 74, 77, 78, 83, 84, 493, 541.5, 951

[56] References Cited

U.S. PATENT DOCUMENTS

| | | | |
|---|---|---|---|
| 5,168,430 | 12/1992 | Nitsch et al. | 361/749 |
| 5,181,854 | 1/1993 | Masuda | 439/67 |
| 5,219,293 | 6/1993 | Imamura | 439/67 |
| 5,267,866 | 12/1993 | Swift et al. | 439/31 |
| 5,308,257 | 5/1994 | Buchter et al. | 439/267 |
| 5,321,585 | 6/1994 | Trittschuh, III et al. | 361/784 |
| 5,350,319 | 9/1994 | Roberts | 439/632 |
| 5,386,341 | 1/1995 | Olson et al. | 361/749 |
| 5,395,251 | 3/1995 | Rodriguez et al. | 439/66 |
| 5,411,402 | 5/1995 | Bethurum | 439/77 |
| 5,462,441 | 10/1995 | Renn et al. | 439/67 |

FOREIGN PATENT DOCUMENTS 1-289190  11/1989  Japan ....................... 439/65

Primary Examiner—Donald Sparks
Attorney, Agent, or Firm—Mark G. Bocchetti

[57] ABSTRACT

A method and device for connecting a flexible circuit to a printed circuit board wherein the device is integral with flexible circuit and the printed circuit board resulting in an improvement in the ease and efficiency of assembly. The printed circuit board includes a cut-out in a side edge thereof to yield an arcuate bearing rim located between a pair of opposing nocks. The printed circuit board includes a plurality of solder pads adjacent the arcuate bearing rim and the arcuate bearing rim has a predetermined length. The flexible circuit includes a pair of opposing notches located one each in a lateral edge of the flexible circuit. The flexible circuit also includes a plurality of solder pads proximate to the pair of opposing notches. The flexible circuit has a predetermined width at across the opposing notches which is substantially equal to the predetermined length of said arcuate bearing rim. The flexible circuit is caused to bow such that it can be inserted into the cut-out so that the notches interlock with the nocks with the flexible circuit engaging the bearing rim to conform to the shape of the bearing rim and automatically align the solder pads of the printed circuit board with the solder pads of the flexible circuit. The electrical and mechanical connection is completed by soldering.

8 Claims, 5 Drawing Sheets

METHOD AND APPARATUS FOR CONNECTING FLEXIBLE CIRCUITS TO PRINTED CIRCUIT BOARDS

BACKGROUND OF THE INVENTION

1. Field of the Invention

The present invention relates generally to electrical printed circuit connections and, more particularly, connecting a flexible circuit to the printed circuit board.

2. Brief Description of the Prior Art

The typical method for achieving an electrical and mechanical connection between flexible-type circuitry and a printed circuit board is through direct soldering. Typically, a lap-type joint is made between the flexible circuit and the printed circuit board by pressing and holding the end of the flexible circuit having upward-facing solder pads against the upward facing solder pads of the printed circuit board and then applying solder to bridge the respective pads. This method creates a rather difficult alignment and stability problem for the person trying to make the solder which can be relatively time consuming.

U.S. Pat. No. 5,321,585 to Trittschuh, III et al teaches a directly solderable circuit board assembly wherein there is a main circuit board having a slot formed therein and an auxiliary circuit board having a projection which is received in the slot of the main circuit board. Conductive pads are formed on both circuit boards at substantially right angles adjacent the intersection of the two circuit boards allowing a solder filler to form a bridge thereby providing both an electrical and a mechanical connection. The slot in the main circuit board may be slightly arched such that the planar projection of the second circuit board will fit snugly into the arched slot to produce a frictional fit.

A variety of other methods and devices are known for making connection between circuit boards or circuit boards and flexible cables. These other methods and devices typically include added connectors which are undesirable due to added cost and space requirements. Examples of such connectors can be found in U.S. Pat. No. 5,462,441 to Renn et al and U.S. Pat. No. 5,350,319 to Roberts.

SUMMARY OF THE INVENTION

It is, therefore, an object of the present invention to provide a method and device for allowing quick alignment and connection between a printed circuit board and a flexible circuit.

Another object of the present invention is to provide an interlocking means between a printed circuit board and a flexible circuit which automatically positions and aligns adjacent solder pads for making a solder connection between the printed circuit board and the flexible circuit.

Yet another object of the present invention is to provide a means for attaching a printed circuit board to a flexible circuit which efficiently holds the respective solder pads of each in a proper alignment and abutment without the need for external constraints or clamps.

Briefly stated, these and numerous other features, objects and advantages of the present invention will become readily apparent upon a reading of the detailed description, claims and drawings set forth herein. These features, objects and advantages for connecting a printed circuit board with a flexible circuit are accomplished by incorporating at least one cut-out in a side edge of the printed circuit board. The cut-out provides the printed circuit board with arcuate bearing rim section with a retaining tab disposed one on each side of the arcuate bearing rim section. The flexible circuit is provided with a pair of opposing notches, one on each side thereof. The opposing notches are located proximate to the solder pads of the flexible circuit which are connected to the conductive runners of the flexible circuit. There are corresponding solder pads located on the printed circuit board immediately adjacent the arcuate bearing rim section with such corresponding solder pads connected, of course, to the conductive runners of the printed circuit board. The flexible circuit is attachable to the printed circuit board, by flexing or bowing the flexible circuit across its width proximate to the opposing notches to thereby allow insertion of the flexible circuit passed between the retaining tabs of the printed circuit. The flexible circuit is, thus, snapped or interlocked into place with the flexible circuit remaining bowed and bearing against the arcuate bearing rim section of the printed circuit board thereby positioning the respective solder pads in proper alignment with one another. The opposing notches in the flexible circuit ensure that the flexible circuit will not slide within the cut-out to move the solder pads of the flexible circuit out of abutting relationship with the solder pads of the printed circuit board. With the flexible circuit so positioned and interlocked with the printed circuit board, the final electrical and mechanical connection can be made by applying solder to bridge the solder pads of the flexible circuit to the solder pads of the printed circuit board.

DETAILED DESCRIPTION OF THE PREFERRED EMBODIMENT

Figure 1:
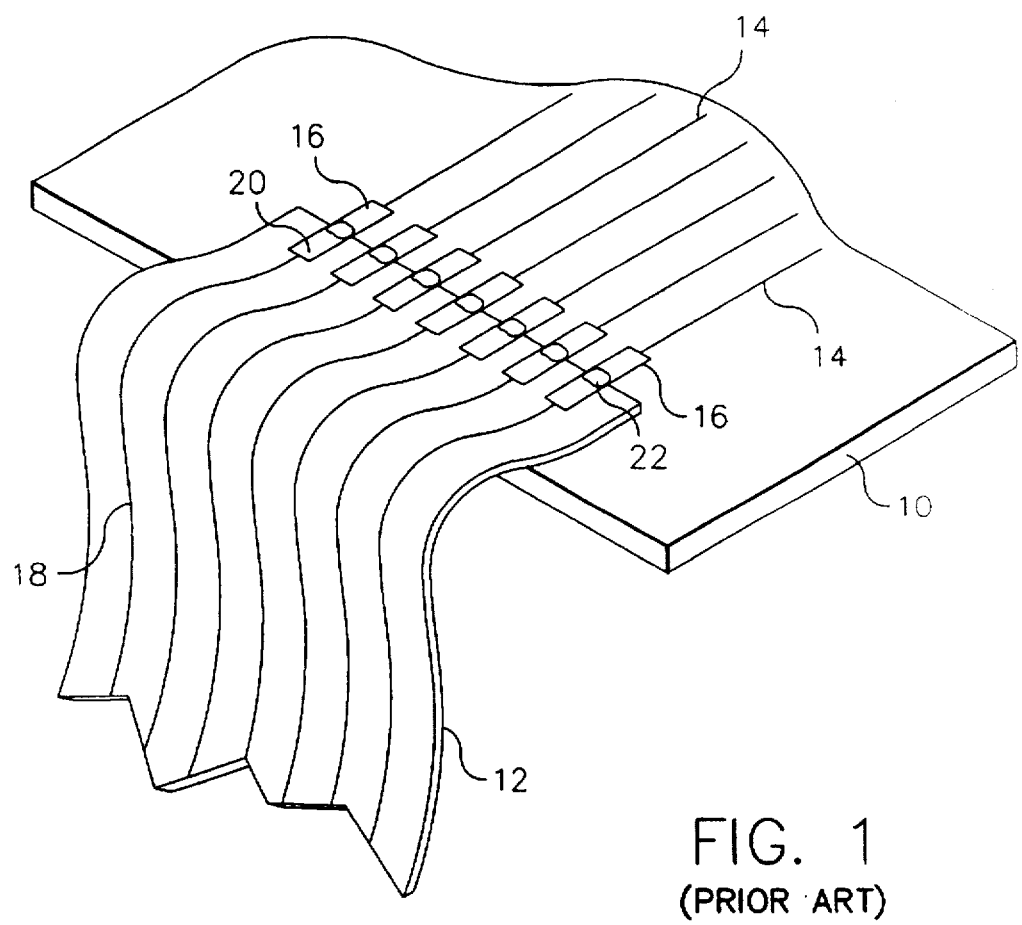
FIG. 1 is a perspective view of a conventional lap type solder connection typical in the prior art for connecting a flexible circuit to a printed circuit board.

Turning first to FIG. 1, there is shown a perspective view of a typical lap joint prior art connection between a printed circuit board 10 and a flexible circuit 12. The substrate of the printed circuit board 10 is generally comprised of epoxy and glass fibers such as that product generally referred to in the industry as FR4 Board. The printed circuit board 10 includes a plurality of conductive runners 14 leading to solder pads 16. The flexible circuit 12 includes a plurality of conductive runners 18 leading to solder pads 20. Attachment of the flexible circuit 12 to the printed circuit board 10 through the solder connection of adjacent solder pads 16, 20 to yield solder fillets 22 becomes a rather labor intensive operation. Generally, the flexible circuit 12 must be wrapped tightly around the edge of the circuit board 10 adjacent to the lap joint. This results in high internal stresses in the flexible circuit 12 due to the severe bending of the flexible circuit 12. Generally, there is a need to clamp down on the solder pad side of the flexible circuit 12 during soldering in order to maintain intimate contact and accurate alignment between the respective solder pads 16, 20.

Figure 2:
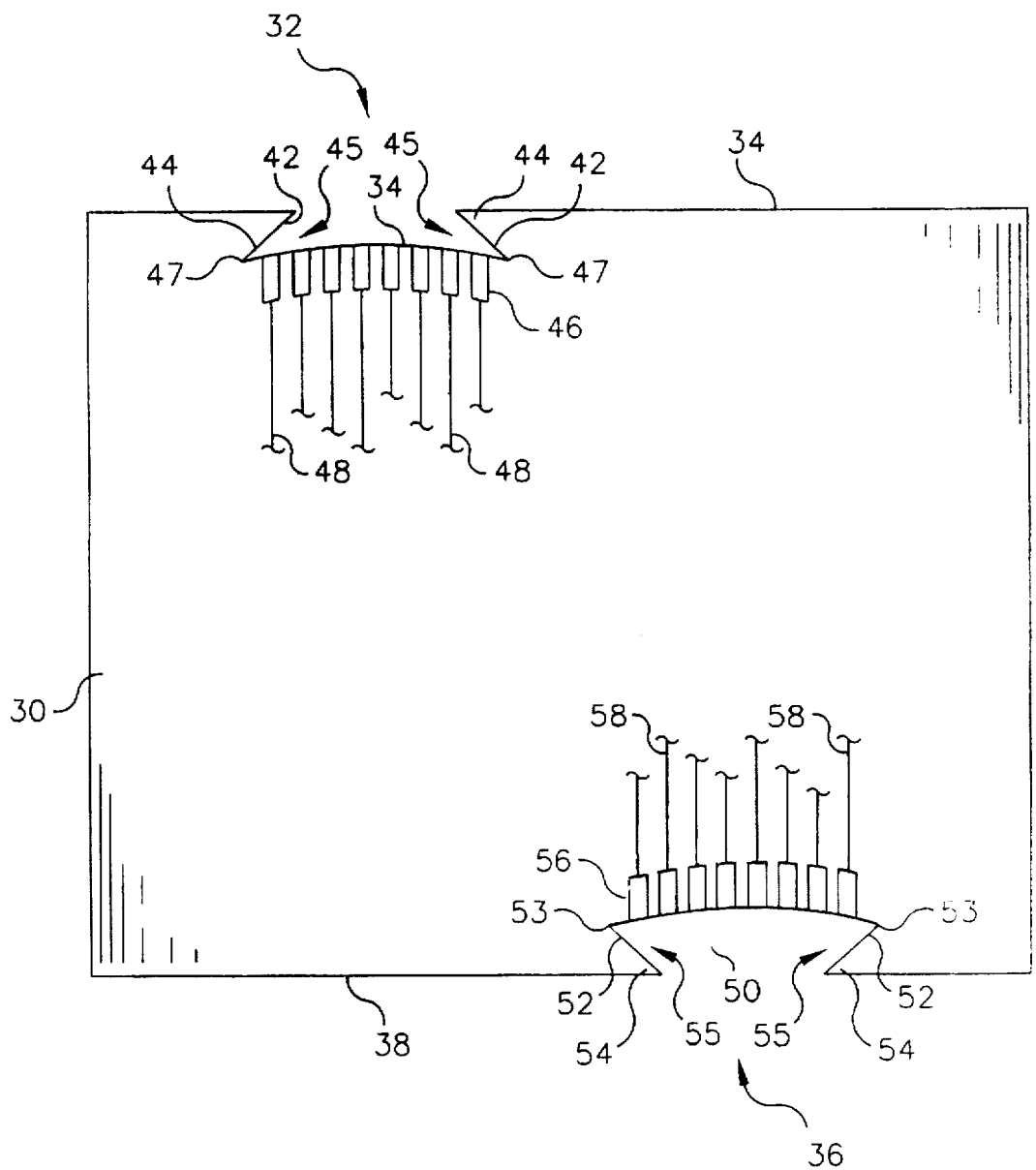
FIG. 2 is a top plan view of a printed circuit board depicting two cut-outs of the present invention for allowing connection to a flexible circuit.

Looking next at FIG. 2, there is shown a top plan view of a printed circuit board 30 which includes a first cut-out 32 in a side edge 34 and a second cut-out 36 in a side edge 38. First cut-out 32 includes an arcuate bearing rim section 40 terminating at each end thereof with the intersection of a guide edge 42. Guide edges 42, in combination with side edge 34, yield acutely angled retainer tabs 44. The intersection of arcuate bearing rim 40 with guide edges 42 results in the formation of a nock 45 at each end of arcuate bearing rim 40. Each nock 45 terminates at an apex 47. There are a plurality of solder pads 46 forming an array positioned adjacent arcuate bearing rim 40. Conductive runners 48 extend from the electric circuit (partially shown) printed on printed circuit board 30 to connect to solder pads 46.

Similarly, cut-out 36 includes an arcuate bearing rim 50 and a pair of opposing guide edges 52. Guide edges 52 in conjunction with side edge 38 yield a pair of opposing retainer tabs 54. The intersection of arcuate bearing rim 50 with guide edges 52 results in the formation of a nock 55 at each end of arcuate bearing rim 50. Residing adjacent arcuate bearing rim 50 and generally over the length thereof are a plurality of solder pads 56 forming an array. There are a plurality of conductive runners 58 which extend from an electrical circuit (partially shown) on printed circuit board 30 and which connect to solder pads 56. Arcuate bearing rim 50 differs from arcuate bearing rim 40 in that arcuate bearing rim 50 is generally concave whereas arcuate bearing rim 40 is generally convex.

Figure 3:
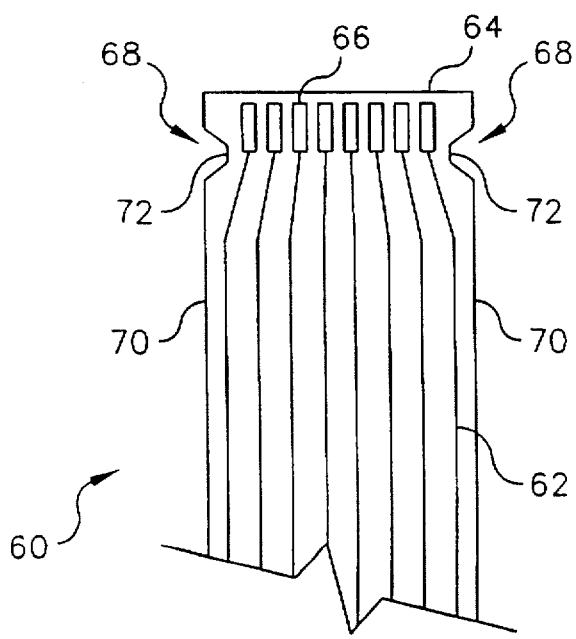
FIG. 3 is a top plan view of a flexible circuit depicting the integral notches of the present invention.

Looking next at FIG. 3, there is shown a top plan view of a piece of flexible circuit 60. The flexible circuit 60 may be made from various substrate materials such as polyimide, polyethyelene terephthalate, or polyethyelene naphthalate. The substrate is generally in a range of from about 0.001 inches to 0.005 inches in thickness. A plurality of conductive runners 62 are printed thereon. Located at the proximal end 64 of the flexible circuit 60 are a plurality of solder pads 66 which form an array, each of the solder pads 66 are connected to one of the conductive runners 62. There is a notch 68 cut or formed into each of the longitudinal edges 70 of the flexible circuit 60. Notches 68 are generally V-shaped and oppose one another. Each notch 68 includes a base lip 72. The length of base lip 72 should be generally equal to the thickness of printed circuit 30. The predetermined width of flexible circuit 60 between base lips 72 of opposing notches 68 is substantially equal to the predetermined arc length of arcuate bearing rims 40,50.

Figure 4:
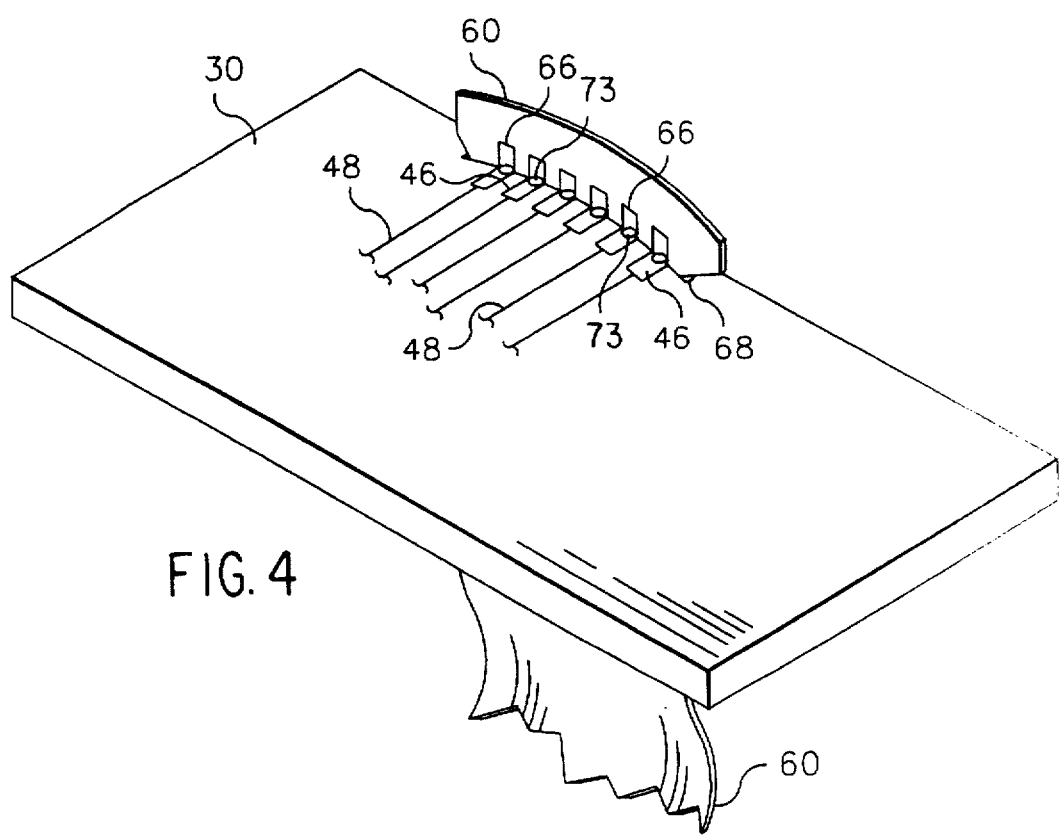
FIG. 4 is a perspective view depicting the flexible circuit and printed circuit board of the present invention interconnected to one another wherein the cut-out in the printed circuit board has a generally convex bearing rim.

Looking next at FIG. 4, it can be seen that when the flexible circuit 60 is inserted into a cut-out 32 of printed circuit board 30, the base lips 72 of notches 68 abut the apexes 47 of nocks 45, 55. In such manner, flexible circuit 60 is interlocked with printed circuit board 30 and held in spring-like fashion within cut-out 32 to thereby conform to the curved, generally convex shape of arcuate bearing rim 40 with the respective solder pads 46 of printed circuit board 30 abutting and aligned with solder pads 66 of flexible circuit 60. Permanent mechanical and electrical connection is accomplished through soldering aligned solder pads 46, 66 together resulting in solder fillets 73.

Figure 5:
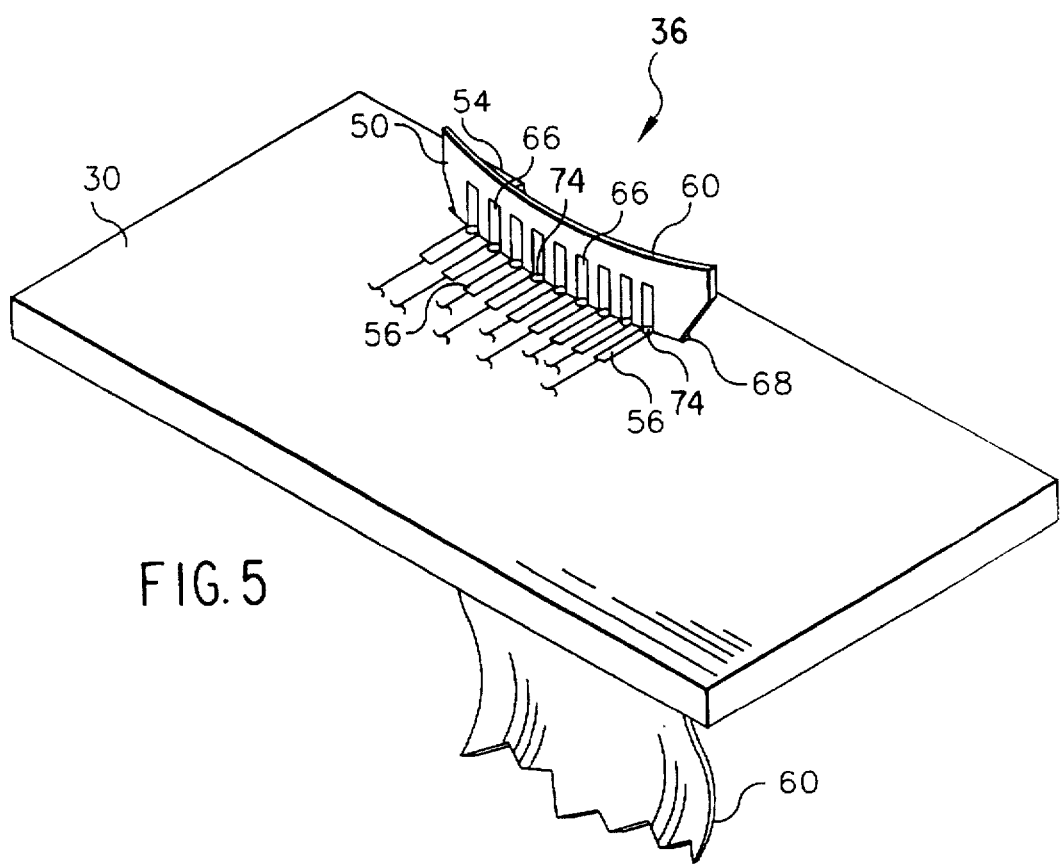
FIG. 5 is a perspective view depicting the flexible circuit and printed circuit board of the present invention interconnected to one another wherein the cut-out in the printed circuit board has a generally concave bearing rim.

Turning to FIG. 5, it can be seen that when the flexible circuit 60 is inserted into a cut-out 36 of printed circuit board 30, the base lips 72 of notches 68 abut the apexes 53 of nocks 55. In such manner, flexible circuit 60 is interlocked with printed circuit board 30 and held in spring-like fashion within cut-out 36 to thereby conform to the curved, generally concave shape of arcuate bearing rims 50 with the respective solder pads 56 of printed circuit board 30 abutting and aligned with solder pads 66 of flexible circuit 60. Permanent mechanical and electrical connection is accomplished through soldering aligned solder pads 56, 66 together resulting in solder fillets 74.

Figure 6:
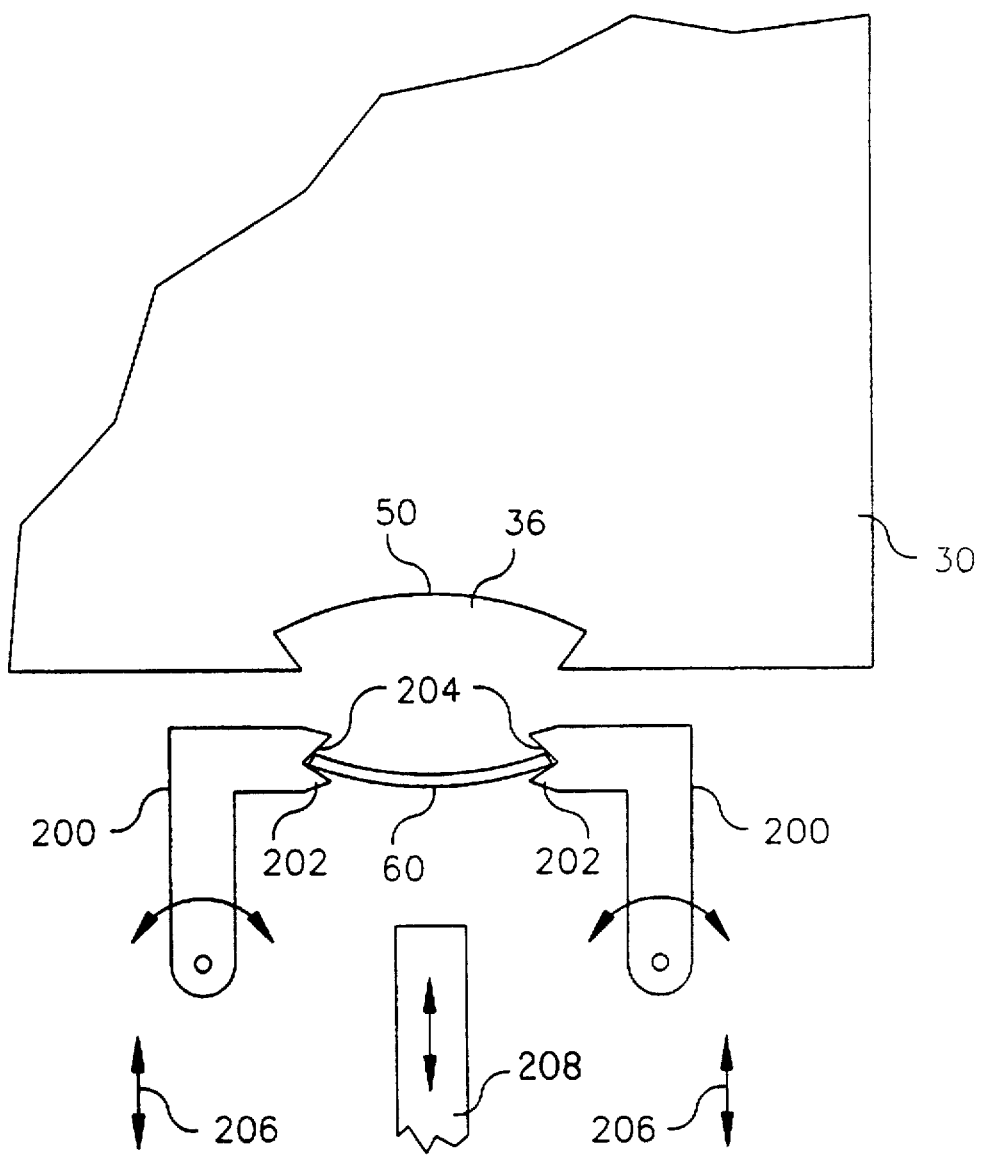
FIG. 6 is a top plan view showing schematically one apparatus for inserting a flexible circuit into the cut-out of a printed circuit board.

There are a variety of methods by which a flexible circuit 60 can be inserted into a cut-out 32, 36. Insertion can, of course, be done manually by the person making the solder, or in preparation for the person to make the solder. Alternatively, insertion can be automated. A schematic approach to automated insertion is depicted in FIG. 6. The apparatus for automated insertion would include a pair of rotatable L-shaped arms 200 connected at a proximal end 202 thereof to means for rotating (not shown) and having at a distal end 204 means for engaging the side edges 70 or notches 68 of the flexible circuit 60 to thereby cause the flexible circuit 60 to take on a more curved or bowed shape as opposed to a flat shape. The means for engaging is preferably a V-shaped gripping surface 205 but other gripping means such as slotted openings or friction surfaces may be substituted therefor. Various means for rotating will be apparent to those skilled in the art. Such means include but would not be limited to motors, pneumatic cylinders, and pneumatic rotary actuators which may be used alone or in combination with cam assemblies, ratchet assemblies, crank assemblies and the like. The method and apparatus for automatically inserting the flexible circuit 60 into the cut-outs 32, 36 would also include means (not shown) for moving rotatable L-shaped arms 200 linearly toward and away from the cut-out 32, 36 as indicated by arrows 206, or alternatively, to move the printed circuit board 30 toward the flexible circuit 60 held between rotatable L-shaped arms 200. Once the flexible circuit has been inserted into cut-out 32 such that notches 68 reside in nocks 45, rotatable L-shaped arms 200 can be rotated out of engagement with the flexible circuit 60 allowing the notches 68 of flexible circuit 60 to interlock within the cut out 32, 36. A piston 208 may be provided to reverse the bias of flexible circuit 60 such that it flexes to bear against arcuate bearing rim 40, 50. The use of piston 208 will, most likely, be needed only with cut-out 36 having an arcuate bearing rim which is concave.

Figure 7:
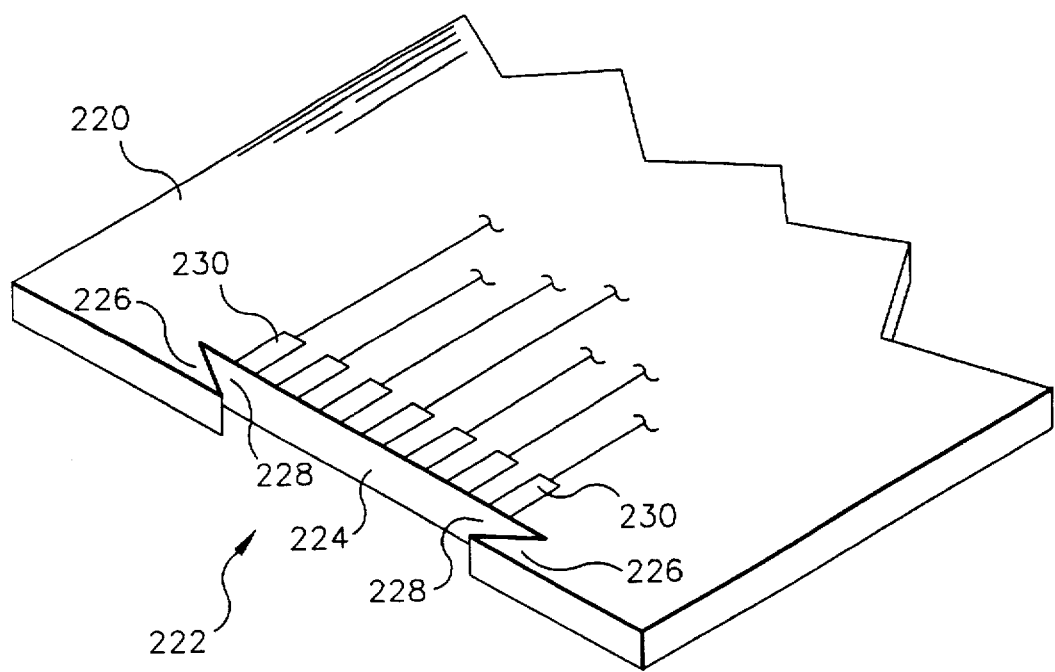
FIG. 7 is a perspective view of an alternative embodiment circuit board cut-out connecting device.
Figure 8:
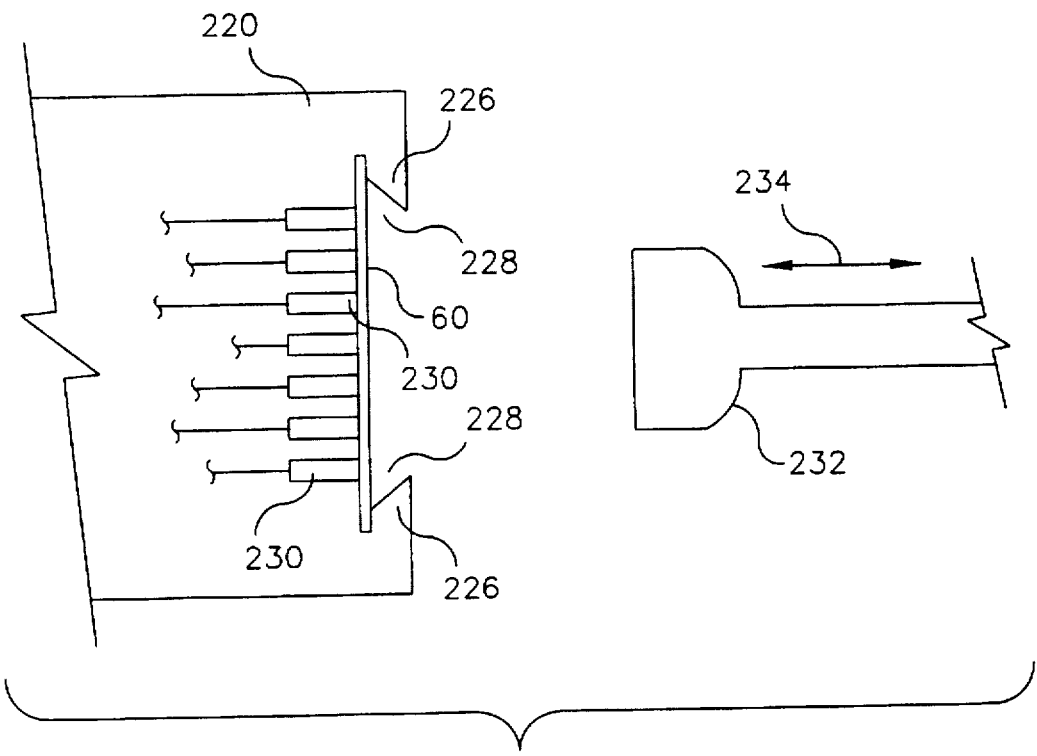
FIG. 8 is a top plan view of the alternative embodiment circuit board cut-out of FIG. 7 with a flexible circuit inserted therein.

There is shown in FIGS. 7 and 8 an alternative embodiment of the present invention wherein a printed circuit board 220 includes a cut-out 222 wherein the bearing rim 224 of cut-out 222 is a straight line segment as opposed to bearing generally arcuate. The cut-out 222 is shaped to provide a pair of opposing retainer tabs 226 which yield opposing nocks 228. Opposing nocks 228 provide interlocking residence for notches 68 of flexible circuit 60. Once again, the printed circuit board 220 would have a plurality of solder pads 230 along bearing rim 224 which would align with the solder pads 66 of flexible circuit 60 once flexible circuit 60 is properly positioned within cut-out 222. In order to make the solder connection between the solder pads 230 of printed circuit board 220 and the solder pads 66 of flexible circuit 60 it will likely be necessary to provide a temporary clamp 232 capable of reciprocating along double arrow 234 to press on the back side of flexible circuit 60 to thereby maintain the straight line configuration of flexible circuit 60 across the width thereof and in abutment with bearing rim 224 while the solder connection is being made. Once the solder connection has been completed the temporary clamp 232 can be removed.

From the foregoing, it will be seen that this invention is one well adapted to attain all of the ends and objects hereinabove set forth together with other advantages which are apparent and which are inherent to the device.

It will be understood that certain features and subcombinations are of utility and may be employed with reference to other features and subcombinations. This is contemplated by and is within the scope of the claims.

As many possible embodiments may be made of the invention without departing from the scope thereof, it is to be understood that all matter herein set forth and shown in the accompanying drawings is to be interpreted as illustrative and not in a limiting sense.

What is claimed is:

1. A device for connecting a flexible circuit to a printed circuit board comprising:
   (a) a cut-out in a side edge of the printed circuit board, said cut-out having an arcuate bearing rim located between a pair of opposing nocks, the printed circuit board including a plurality of solder pads adjacent said arcuate bearing rim, said arcuate bearing rim having a predetermined length;
   (b) a pair of opposing notches in the flexible circuit, said pair of opposing notches located one each in a lateral edge of the flexible circuit, the flexible circuit including a plurality of solder pads proximate to said pair of opposing notches, the flexible circuit having a predetermined width at said opposing notches which is substantially equal to said predetermined length of said arcuate bearing rim.

2. A device as recited in claim 1 further comprising:
   a plurality of solder fillets connecting said plurality of solder pads proximate said pair of opposing notches to said plurality of solder pads adjacent said arcuate bearing rim.

3. A printed circuit board including a device for connecting said printed board to a flexible circuit, said printed circuit board comprising:
   (a) a conductive pattern formed in a predetermined design on a surface of an insulating base, said insulating base having a plurality of side edges;
   (b) a plurality of conductive runners electrically connected to said conductive pattern;
   (c) a cut-out in one of said plurality of said side edges, said cut-out having an arcuate bearing rim located between a pair of opposing nocks, the printed circuit board including a plurality of solder pads adjacent said arcuate bearing rim, said arcuate bearing rim having a predetermined length, said solder pads electrically connected to said conductive runners.

4. A device for connecting a flexible circuit to a printed circuit board comprising:
   (a) a cut-out in a side edge of said printed circuit board, said cut-out having an bearing rim located between a pair of retaining tabs which are integral to said printed circuit board, each of said retaining tabs extending out over a portion of said bearing rim, said printed circuit board including a plurality of solder pads adjacent said bearing rim, said bearing rim having a predetermined length;
   (b) a pair of opposing notches in said flexible circuit, said pair of opposing notches located one each in a lateral edge of said flexible circuit, said flexible circuit including a plurality of solder pads proximate to said pair of opposing notches, the flexible circuit having a predetermined width between said opposing notches which is substantially equal to said predetermined length of said bearing rim such that said flexible circuit is insertable into said cutout to abut said bearing edge with said opposing notches interlocking with said retaining tabs.

5. A device as recited in claim 4 wherein:
   said bearing rim is arcuate.

6. A device as recited in claim 5 further comprising:
   a plurality of solder fillets connecting said plurality of solder pads proximate said pair of opposing notches to said plurality of solder pads adjacent said arcuate bearing rim.

7. A method for connecting a flexible circuit to a printed circuit board comprising the steps of:
   (a) providing the printed circuit board with a cut-out in a side edge thereof thereby yielding a bearing rim with a nock on each end of the bearing rim, with a retainer tab extending from each end of said bearing rim out over a portion of said bearing rim, the printed circuit board having a first array of solder pads along said bearing rim;
   (b) providing a flexible circuit with a notch in each of two lateral edges, the flexible circuit having a second array of solder pads located along on a surface thereof proximate to the notches;
   (c) inserting the flexible circuit into the cut-out so that the notches interlock with the nocks;
   (d) causing the flexible circuit engaging the bearing rim to conform to the shape of the bearing rim to thereby automatically align the first array with the second array;
   (e) making a solder connecting between the first array and the second array.

8. A method as recited in claim 7 wherein:
   the bearing rim created in said first providing step is arcuate.

* * * * *